(12) United States Patent
Kojima

(10) Patent No.: US 7,924,084 B2
(45) Date of Patent: Apr. 12, 2011

(54) SEMICONDUCTOR DEVICE

(75) Inventor: Masaki Kojima, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/146,863

(22) Filed: Jun. 26, 2008

(65) Prior Publication Data

US 2009/0002055 A1    Jan. 1, 2009

(30) Foreign Application Priority Data

Jun. 26, 2007  (JP) ................................ 2007-167626

(51) Int. Cl.
     *H03K 17/687*  (2006.01)
(52) U.S. Cl. ........ 327/427; 327/108; 327/309; 327/379; 327/18; 327/77; 323/364; 361/90; 361/91.2; 330/251; 330/297; 381/94.5
(58) Field of Classification Search .................... 327/18, 327/20, 77, 78, 80, 81, 88, 143, 59–61, 199, 327/200, 108–112, 309–330, 379–384, 427; 323/364, 370; 361/90, 91.2, 91.5, 56, 58, 361/118; 330/251, 297, 261; 381/94.5, 120
See application file for complete search history.

(56) References Cited

U.S. PATENT DOCUMENTS

| | | | | |
|---|---|---|---|---|
| 5,592,117 A * | 1/1997 | Nadd | ............................ | 327/374 |
| 5,811,996 A * | 9/1998 | Oyabe et al. | ................... | 327/110 |
| 5,838,526 A * | 11/1998 | Ishikawa et al. | ............... | 361/118 |
| 5,946,177 A * | 8/1999 | Miller et al. | ..................... | 361/56 |
| 6,396,249 B1 * | 5/2002 | Itakura et al. | ................. | 323/273 |
| 7,382,592 B2 * | 6/2008 | Chen et al. | ....................... | 361/56 |
| 2003/0076642 A1 * | 4/2003 | Shiner et al. | ................. | 361/91.6 |
| 2004/0263132 A1 * | 12/2004 | Fukami | ......................... | 323/210 |
| 2007/0121358 A1 * | 5/2007 | Hirota et al. | ...................... | 365/1 |
| 2008/0067598 A1 * | 3/2008 | Chiang et al. | .................. | 257/355 |

FOREIGN PATENT DOCUMENTS

| | | |
|---|---|---|
| JP | 3-166816 | 7/1991 |
| JP | 5-6966 | 1/1993 |

* cited by examiner

*Primary Examiner* — Lincoln Donovan
*Assistant Examiner* — Shikha Goyal
(74) *Attorney, Agent, or Firm* — Young & Thompson

(57) ABSTRACT

A switching transistor has its drain and source respectively connected to a gate and a source of an output transistor for supplying output current to a load, and its gate connected to an internal grounding wire GW to be connected to a grounding terminal GND. A resistance element R1 connects the gate to the source of the switching transistor. When a voltage not smaller than a predetermined value is generated across the resistance element R1 at turn-on, due to a parasitic capacitance existing between a power supply terminal. Vcc and the internal grounding wire GW, the switching transistor can be turned on to turn off the output transistor.

14 Claims, 6 Drawing Sheets

SEMICONDUCTOR DEVICE

BACKGROUND OF THE INVENTION

1. Field of the invention

The present invention relates to a semiconductor device, and particularly to protection techniques for a circuit for driving a power MOSFET functioning as a switch.

2. Description of Related Art

In recent years, a relay used for a unit in automobile electric equipment has been replaced with a semiconductor device such as a power MOSFET for contactless switching. Also, an intelligent power device (IPD) has been used that includes protective functions such as a current limiting circuit, an overheat sensing circuit and a wire break sensing circuit for the power MOSFET, and is capable of transferring the result of self-diagnosis to a control microprocessor.

In such IPD, when a break of a grounding wire of the IPD occurs (ground float), an output of the IPD will be turned on, though desired to be turned off, and thereby the IPD itself may be damaged. Then, it is required for the IPD to include a break sensing function as one of the protective functions. For example, Japanese Patent Laid-Open No. 3-166816 discloses a semiconductor integrated circuit device which protects its element from being damaged due to a break of a grounding wire. This semiconductor integrated circuit device includes a grounding wire break detection circuit for detecting whether or not electrical current flows through a grounding wire, and a switch element for forcibly turning off a power output element according to a wire break detection output signal supplied from the grounding wire break detection circuit. According to such semiconductor integrated circuit device, because the power output element is forced to be turned off when a break of a grounding wire or a poor electrical contact occurs in an IC, an element can be protected from generating heat and being destroyed by the heat FIG. 4 is a circuit diagram of the semiconductor integrated circuit device shown in Japanese Patent Laid-Open No. 3-166816. In FIG. 4, when an input terminal IN connected to an input port of an inverter circuit N1 becomes a high level, a gate potential of a MOSFET Q2 connected to an output port of the inverter circuit N1 becomes a low level. The MOSFET Q2, then, is brought into an off state, and an output voltage of a booster circuit BST is supplied to a gate of a power MOSFET Q1 to turn on the power MOSFET Q1. On the one hand, when the input terminal IN becomes a low level, the MOSFET Q2 is turned on, and the power MOSFET Q1 is turned off because the gate is separated from the output voltage of the booster circuit BST.

A grounding wire break detection circuit, here, includes a current mirror circuit composed of transistors T1 and T2, and a resistor R1. When a GND terminal is normally connected to an external ground potential, bias current flows in the current mirror circuit. In this case, the transistor T2 is brought into an on state, and a collector potential of the transistor T2 becomes a low level. Accordingly, a MOSFET Q3 is turned off, and the gate of the power MOSFET Q1 will not be affected.

On the other hand, when the GND terminal is in a wire break state, electric current does not flow through a current path formed of the resistor R1 and the transistor T1, and the transistor T2 is turned off. Accordingly, a power supply VDD provides a gate potential of the MOSFET Q3 through a transistor T3 and a resistor R2, and the gate potential rises. Accordingly, the MOSFET Q3 is brought into an on state, and the MOSFET Q1 is forced to be turned off. Accordingly, heat generated by electric current flowing through the MOSFET Q1 and element destruction caused by the heat can be prevented.

In addition, Japanese Patent Laid-Open No. 5-6966 discloses an electric circuit device, as the related art, which can normally operate even when a terminal of one internal circuit to be connected to a predetermined, external potential, for example, a grounding terminal, is disconnected to become open, and report outside that the grounding terminal is brought into the open state.

By the way, in a semiconductor integrated circuit device (semiconductor device), for example, as shown in FIG. 5, a P-type diffusion layer is formed on an N-type substrate connected to a power supply terminal Vcc, and an integrated circuit is formed thereon. The P-type diffusion layer, then, is connected to a grounding terminal GND. In such semiconductor integrated circuit device configured as described above, there is a parasitic capacitance Cj between the N-type substrate and the P-type diffusion layer, generated by a pn-junction reversely biased.

FIG. 6 schematically shows the presence of a parasitic capacitance in a semiconductor device working as the IPD. In FIG. 6, the semiconductor device, which is the IPD, is supplied with power (for example, 14V) by a power supply such as a battery to a power supply terminal Vcc, and supplies a load with power through an output terminal OUT. The semiconductor device functions as a switch for determining whether or not power is supplied to the load, based on an active signal selectively applied to an input terminal IN. There is, as shown in FIG. 5, a parasitic capacitance Cj between an internal GND (an internal grounding wire) to be connected to a grounding terminal GND of such semiconductor device and the power supply terminal Vcc.

The present inventor has recognized that, in such semiconductor device, a damage of an output MOS transistor caused by a GND wire break may often stem from a half-on state of the output MOS transistor produced at power-on by a parasitic capacitance Cj between Vcc and GND (the half-on state is that a transistor is not completely turned on, and has a potential between a drain and a source).

FIG. 7 shows an example of change in inrush current Id generated by a parasitic capacitance of a semiconductor device. FIG. 7 shows that the inrush current Id goes up to 2 to 4 (A) when the parasitic capacitance Cj ($C_{VCC-GND}$) is 50, 75 and 100 pF.

By the way, the semiconductor integrated circuit device described in Japanese Patent Laid-Open No. 3-166816 detects whether or not electric current flows through a grounding wire. That is, when electric current is made to flow full-time in a grounding wire break detection circuit for detecting whether or not the electric current flows through the grounding wire, a grounding wire break is determined based on detecting no electric current flowing through the grounding wire.

When power is applied to such semiconductor integrated circuit device, with the grounding wire being broken, then a collector of the transistor T2 is charged up through a transistor T3 and a resistor R2 shown in FIG. 4, and the MOSFET Q3 is turned on. At this time, to control circuit current to be lower, a resistor having a satisfactorily large value has to be used for the resistor R2. Accordingly, a collector potential of the transistor T2 rises slowly, resulting in a late timing to forcibly turn off the MOSFET Q1, so that the MOSFET Q1 may be damaged. Especially, the late detection at power-on is more likely to cause a crucial damage.

SUMMARY

A semiconductor device according to one aspect of the present invention includes: a switching MOS transistor in which a drain and a source thereof are respectively connected to a gate and a source of an output MOS transistor for supplying output current to a load, and a gate thereof is connected to an internal grounding wire to be connected to a grounding terminal; and an electric potential difference generating circuit for connecting the gate to the source of the switching MOS transistor.

According to the present invention, the switching MOS transistor quickly detects float of the gate of the output MOS transistor generated at occurrence of a grounding wire break, and connects the gate to the source of the output MOS transistor. Accordingly, the output MOS transistor is brought into an electrically conductive state, so that it can be prevented from generating heat and being damaged.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

Figure 1:
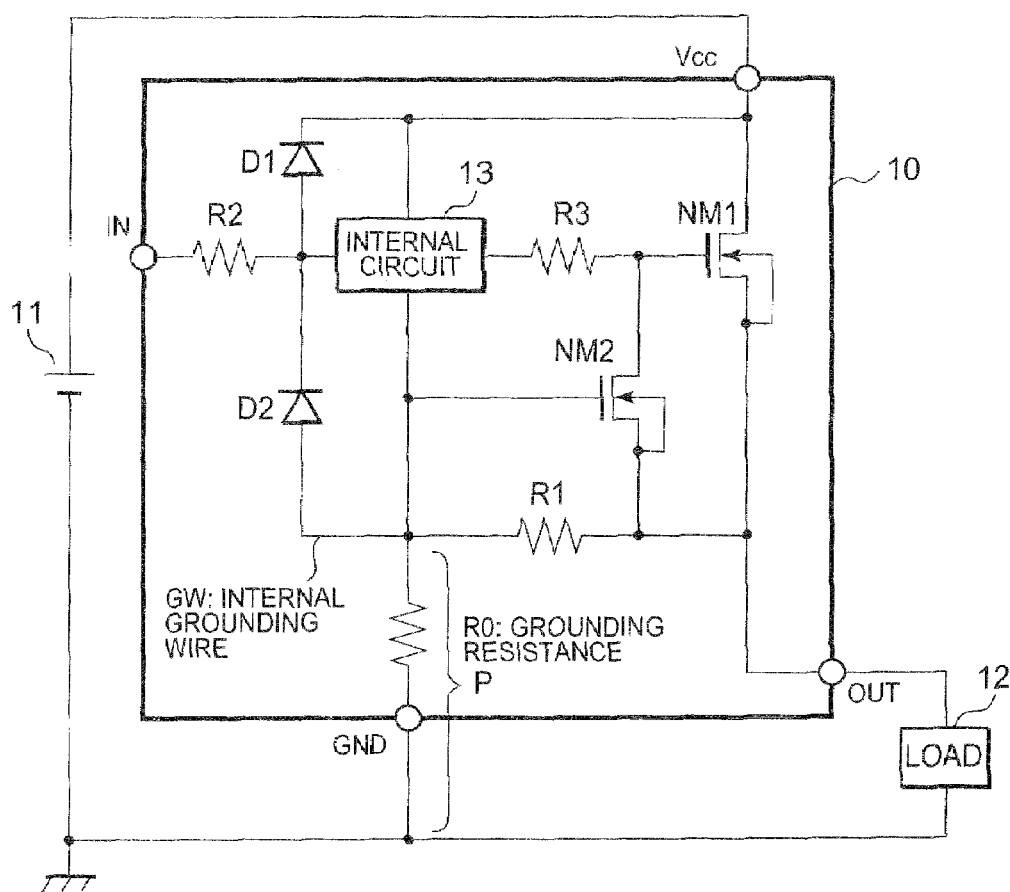
FIG. 1 is a circuit diagram of a semiconductor device according to a first embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

A semiconductor device according to an embodiment of the present invention includes: a switching MOS transistor (NM2 in FIG. 1) in which a drain and a source thereof are respectively connected to a gate and a source of an output MOS transistor (NM1 in FIG. 1) for supplying output current to a load (12 in FIG. 1), and a gate thereof is connected to an internal grounding wire to be connected to a grounding terminal; and an electric potential difference generating circuit (R1 in FIG. 1) for connecting the gate to the source of the switching MOS transistor.

The semiconductor device of the present invention is preferably configured so that, when a voltage not smaller than a predetermined value is generated across the electric potential difference generating circuit at power-on, due to a parasitic capacitance existing between a power supply and an internal grounding wire (GW in FIG. 1), the switching MOS transistor is turned on, and during normal operation, the voltage across the electric potential difference generating circuit is smaller than the predetermined value, and the switching MOS transistor is in an off state.

The semiconductor device of the present invention may further include: an output terminal (OUT in FIG. 1); a grounding terminal (GND in FIG. 1); and the output MOS transistor for supplying output current to the load through the output terminal.

In the semiconductor device of the present invention, the electric potential difference generating circuit may include any one of a resistance element, a diode, a constant current circuit, and a MOS transistor, or a combinational circuit including two or more of them.

The semiconductor device of the present invention may include an input terminal (IN in FIG. 2), and a first and second diodes (D2 and D4 in FIG. 2) which are connected in series between the input terminal and the internal grounding wire, and arranged in a direction opposed to each other. The electric potential difference generating circuit may be a circuit formed by connecting a resistance element (R1 in FIG. 2) to a third diode (D3 in FIG. 2) in series.

The semiconductor device of the present invention may further include: a booster circuit (14 in FIG. 3) for supplying a boosted voltage to the gate of the output MOS transistor so that the output MOS transistor is turned on when an active signal is applied to the input terminal; and a control MOS transistor (NM3 in FIG. 3) whose gate and source are connected to the gate and the source of the switching MOS transistor, respectively, for controlling the booster circuit to stop supplying the boosted voltage to the gate of the output MOS transistor when the voltage not smaller than the predetermined value is generated across the electric potential difference generating circuit.

In the semiconductor device configured as described above, when power is turned on in a state of a grounding wire break, a voltage of the internal grounding wire rises following a power supply voltage due to the parasitic capacitance between a power supply wire and the internal grounding wire. The raised potential of the internal grounding wire causes the switching MOS transistor to turn on, and thereby the gate and the source of the output MOS transistor are instantaneously connected to each other. Accordingly, the output MOS transistor is prevented from half-on.

Also, the semiconductor device can operate without standby current. Further, the semiconductor device is configured so that a detection function does not need the standby current, and consumes current only during an abnormal state, and is, consequently, useful as a low power consumption circuit.

Embodiments will be hereinafter described in detail with reference to the accompanying drawings.

First Embodiment

FIG. 1 is a circuit diagram of a semiconductor device according to a first embodiment of the present invention. In FIG. 1, a semiconductor device 10 functions as a high-side switch for connecting a power supply device 11 such as a battery to a load 12. The semiconductor device 10 includes a power supply terminal Vcc, an output terminal OUT, an input terminal IN, a grounding terminal GND, NMOS transistors NM1 and NM2, an internal circuit 13, resistance elements R1, R2 and R3, and diodes D1 and D2.

The NMOS transistor NM1 is an output MOS transistor for supplying output current to the load 12, and has its drain connected to the power supply terminal Vcc, its source connected to the output terminal OUT, and its gate connected to an output port of the internal circuit 13 through the resistance element R3.

The NMOS transistor NM2 has its drain connected to the gate of the NMOS transistor NM1, its source connected to the source of the NMOS transistor NM1, and its gate connected to one end of the internal grounding wire GW.

The resistance element R1 is connected between the gate and the source of the NMOS transistor NM2. In detail the resistance R1 is connected between the internal grounding wire GW, which is connected to the gate of the NMOS transistor NM2, and the source of the NMOS transistor NM2. In addition, instead of the resistance element R1, an electric potential difference generating circuit may be used that generates an electric potential difference between the internal grounding wire GW and the output terminal OUT so as to turn on the NMOS transistor NM2, due to a raised potential of the internal grounding wire GW. For example, as the electric potential difference generating circuit, a resistance element, a diode, a constant current circuit, and a MOS transistor, or a combination thereof may be used.

The internal circuit 13 has its input port connected to the input terminal IN through the resistance element R2, and its output port connected to the gate of the NMOS transistor NM1 through the resistance element R3. Further, a port on the side of the power supply is connected to the power supply terminal Vcc, and a port on the side of the ground is connected to one end of the internal grounding wire GW. The internal circuit 13 is supplied with power from connection to the power supply terminal Vcc, and connected to the internal grounding wire GW.

The diode D1 has its anode side connected to the input port of the internal circuit 13, and its cathode side connected to the power supply terminal Vcc.

The diode D2 has its anode side connected to the internal grounding wire GW, and its cathode side connected to the input port of the internal circuit 13.

The diodes D1 and D2 operate to discharge into the power supply terminal Vcc or the grounding terminal GND when an abnormal voltage such as static electricity is applied to the input terminal IN, and thereby protect the internal circuit 13 and the like from being damaged by electrostatic discharge.

The internal grounding wire GW connects to the grounding terminal GND through a grounding resistance R0. In addition, assuming that the grounding resistance R0 represents a resistance existing in a wiring path P from the internal grounding wire GW to a grounding point of the power supply device 11 through the grounding terminal GND. There is, as described above, the parasitic capacitance between the internal grounding wire GW and the power supply terminal Vcc, caused by the pn-junction not shown.

In the semiconductor device 10 configured as described above, when an active signal is applied to the input terminal IN, the internal circuit 13 outputs a high level to the gate of the NMOS transistor NM1 through the resistance element R3. Accordingly, the NMOS transistor NM1 is brought into an on state to supply power to the load 12. Also, when the active signal is not applied to the input terminal IN, the internal circuit 13 outputs a low level, and accordingly, the NMOS transistor NM1 is brought into an off state to stop the supplying of power to the load 12. During such normal operation, the gate of the NMOS transistor NM2 has about a ground potential, and the NMOS transistor NM2 will not be turned on.

By the way, in FIG. 1, the case is considered that the load 12 is connected to the output terminal OUT, and the NMOS transistor NM1 which is an output transistor is in an off state. Because the NMOS transistor NM1 is in an off state, a potential of the output terminal OUT is approximately equal to a ground potential of the load 12. Accordingly, a source potential of the NMOS transistor NM2 is approximately equal to the ground potential of the load 12. Further, the case is considered that a wire is broken between the internal grounding wire GW and the grounding terminal GND, or between the grounding terminal GND and the ground side of the power supply device 11. That is, there is a wire break in the wiring path P. A description will be hereinafter provided, assuming that the grounding resistance R0 has an infinite value in these situations.

In these situations, when a potential of the power supply terminal Vcc is rapidly raised, a potential of the internal grounding wire GW, that is, a potential of the gate of the NMOS transistor NM2 instantaneously rises due to the parasitic capacitance existing between the power supply terminal Vcc and the internal grounding wire GW. Accordingly, the NMOS transistor NM2 is quickly turned on, and the gate and the source of the NMOS transistor NM1 are connected to each other through low impedance. Consequently, the NMOS transistor NM1 is brought into an off state.

Then, assuming that, in the state of the power supply voltage being applied, the input terminal IN is turned into an active state At this time, the wiring path P has the wire break. However, the potential of the internal grounding wire GW is not an arbitrary potential and the NMOS transistor NM1 is in an off state, thereby providing a state that the potential of the output terminal OUT is approximately equal to the ground potential of the load 12. Here, because dark current will not be zero, at the moment of setting the input terminal IN to be active, circuit current flows from the internal circuit 13 through the internal grounding wire GW, and the resistance element R1 into the output terminal OUT. Accordingly, there is a voltage of I (circuit current)×R1 generated between the gate and the source of the NMOS transistor NM2. This voltage turns on the NMOS transistor NM2, and thereby the gate and the source of the NMOS transistor NM1 are connected to each other through low impedance. Consequently, the NMOS transistor NM1 is brought into an off state.

As described above, in either case, the NMOS transistor NM2 functions as a switch for shorting the gate to the source of the NMOS transistor NM1. In this case, because the gate potential of the NMOS transistor NM2 rises quite instantaneously, the protective function against a damage of the NMOS transistor NM1 is superior to that of a conventional circuit.

Second Embodiment

Figure 2:
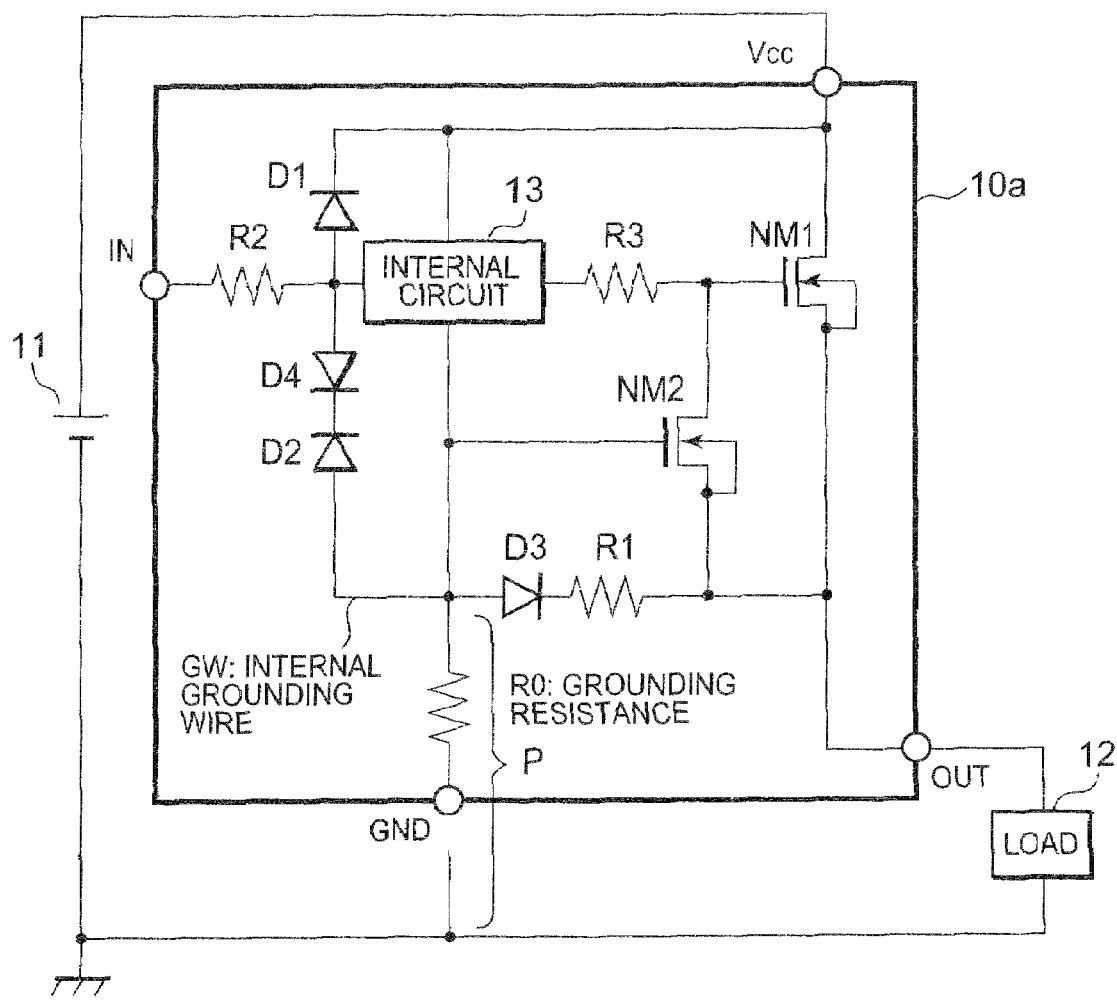
FIG. 2 is a circuit diagram of a semiconductor device according to a second embodiment of the present invention.

FIG. 2 is a circuit diagram of a semiconductor device according to a second embodiment of the present invention. In FIG. 2, like symbols as those in FIG. 1 indicate like components, and a description thereof will be omitted. A semiconductor device 10a in FIG. 2 additionally has diodes D3 and D4 to the semiconductor device 10 in FIG. 1. The diode D3 is inserted between the internal grounding wire GW and the resistance element R1, and has its anode side connected to the internal grounding wire GW, and its cathode side connected to the resistance element R1. The diode D4 is inserted between the input port of the internal circuit 13 and the diode D2, and has its anode side connected to the input port of the internal circuit 13, and its cathode side connected to the cathode side of the diode D2. In addition, the diodes D2 and D4 may switch their positions with each other, and the diode D3 and the resistance element R1 may switch their positions with each other.

The input terminal IN is connected to the diode D1 which is a protective element and the diode D2 through the diode D4. By setting the input terminal IN to a high level or a low level, the semiconductor device 10a is set in an active operation mode. That is, the internal circuit 13 generates a boosted voltage to supply it to the gate of the NMOS transistor NM1. In this case, the input terminal IN, generally, is brought into a pull-up or pull-down state. Operation of the semiconductor device 10a dependent on difference in an input will be hereinafter described.

(1) The Case where the Input Terminal IN is a Pull-Up Circuit (Active by a Low Input)

In the case of automobile equipment, by earthing the input terminal IN to the GND side of the power supply device 11 rather than the internal GND (the internal grounding wire GW), the input terminal IN is set to be active. When the input terminal IN is set to be active in a state that the GND is separated from the internal grounding wire GW, circuit current flows from the internal grounding wire GW through the diode D2 and the resistance element R2 into the input terminal IN (GND) if there is not the diode D4 (in connection). If R1>>R2, the circuit current scarcely flows through the resistance element R1, not leading to an on state of the NMOS transistor NM2. Accordingly, the NMOS transistor NM1 will start to be turned on. At this time, the potential between the power supply terminal Vcc and the internal grounding wire GW is "VCC (the potential of the power supply terminal Vcc)−I (current through R2)×R2−VF (forward voltage drop of the diode D2)". If a booting function in the internal circuit 13 works at this potential so as to provide gate boosting sufficient to turn on the NMOS transistor NM1, the NMOS transistor NM1 does not lead to destruction. However, if the gate boosting is not provided sufficiently to turn on the NMOS transistor NM1, the NMOS transistor NM1 may be brought into a half-on state, thereby leading to destruction.

Then, to cause the circuit current not to flow through a path from the internal grounding wire GW through the diode D2 and the resistance element R2 to the input terminal IN (GND), the diode D4 is additionally inserted in the reverse direction. By adding the diode D4, the circuit current is blocked from flowing, and on an active input, the circuit current will flow only through the resistance element R1. Accordingly, the NMOS transistor NM2 can be turned on, and thereby continuously maintaining the NMOS transistor NM1 in an off state.

(2) The Case where the Input Terminal IN is a Pull-Down Circuit (Active by a High Input)

Generally, a pull-down potential is the internal GND, and when the GND is separated from the internal grounding wire GW, the potential of the internal grounding wire GW is not larger than "(the potential of the output terminal OUT≈the potential on the GND side of the load 12)+VF (the forward voltage drop of the diode D3)". When the input terminal IN is set to a high level, electrical current is generated that flows from the input terminal IN through the resistance element R2, the internal circuit 13, the internal grounding wire GW and the resistance element R1 to the output terminal OUT. Through the resistance element R1, in addition to this current, the circuit current of the internal circuit 13 will flow. Accordingly, a voltage is generated between the gate and the source of the NMOS transistor NM2 to turn on the NMOS transistor NM2, and thereby the gate and the source of the NMOS transistor NM1 are connected to each other through low impedance.

In addition, in the operation described above, in a "normal state" that the GND is not separated from the internal grounding wire GW, undesired circuit current will not be generated, and standby current is zero.

In the above configuration, the diode D3 may preferably take a VF value (the forward voltage drop value) not smaller than a threshold value (VT) of the NMOS transistor NM2. That is, impedance between the VCC and the internal grounding wire GW does not have an infinite value, and a fine current path is generated from the power supply terminal Vcc to the output terminal OUT, even if the GND is separated from the internal grounding wire GW. Accordingly, it is because the potential of the internal grounding wire GW is "(the potential of the output terminal OUT≈the potential on the GND side of the load 12)+VF". That is, by setting the VF value of the diode D3 not smaller than the VT of the NMOS transistor NM2, the gate and the source of the NMOS transistor NM1 becomes connected to each other before the circuit current starts to flow, providing a safer protective circuit configuration. In addition, not only by increasing the VF value of the diode D3, but by increasing the number of diodes connected in series, it is possible to adjust the VF value to be not smaller than the VT of the NMOS transistor NM2.

According to the semiconductor device configured as described above, independent of the difference in the input signal (high active and low active), the internal GND potential is quickly detected at a GND wire break, thereby connecting the gate and the source of the NMOS transistor NM1 to each other. Accordingly, the NMOS transistor NM1 can be prevented from the half-on operation.

Third Embodiment

Figure 3:
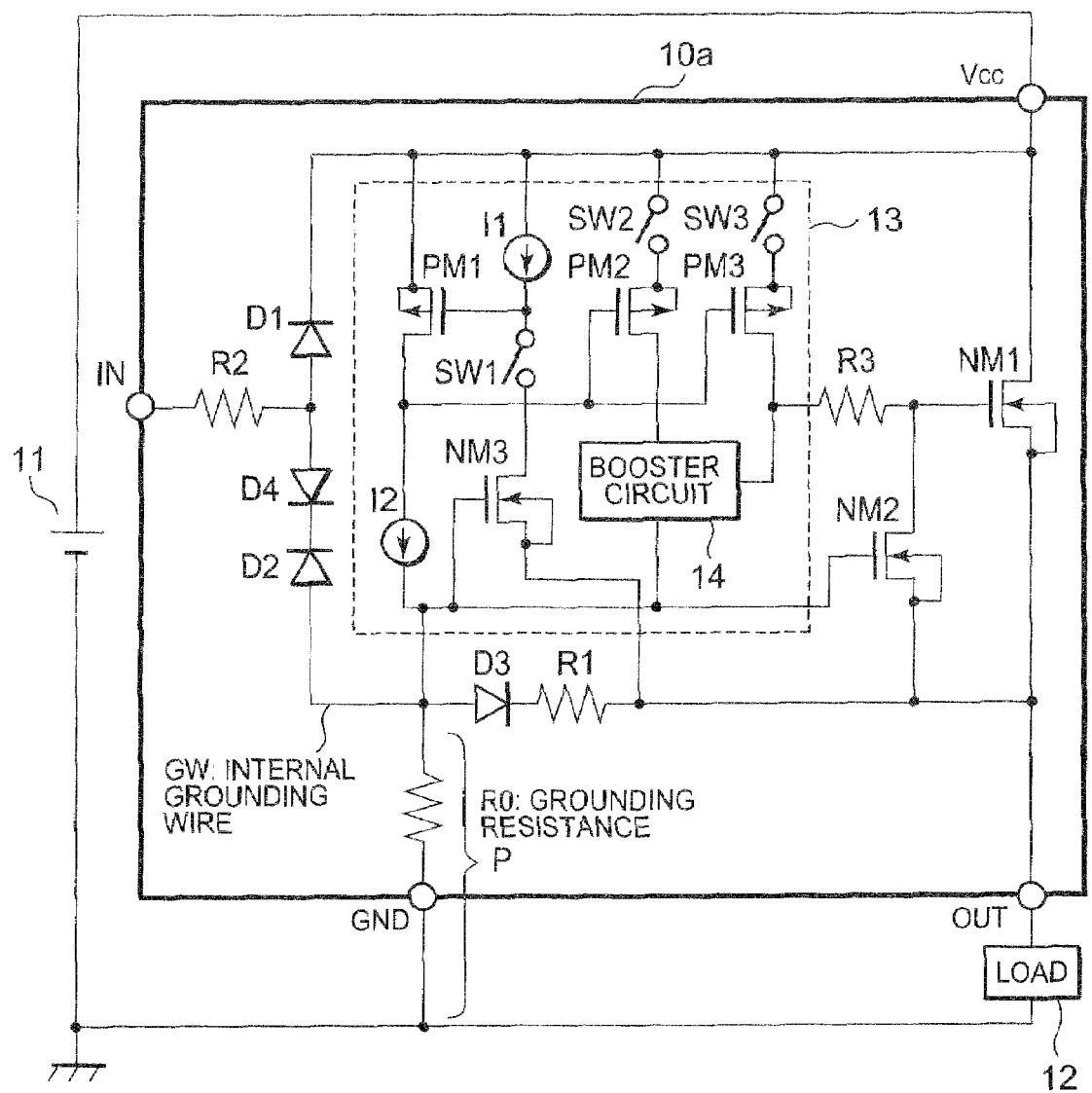
FIG. 3 is a circuit diagram of a semiconductor device according to a third embodiment of the present invention.
Figure 4:
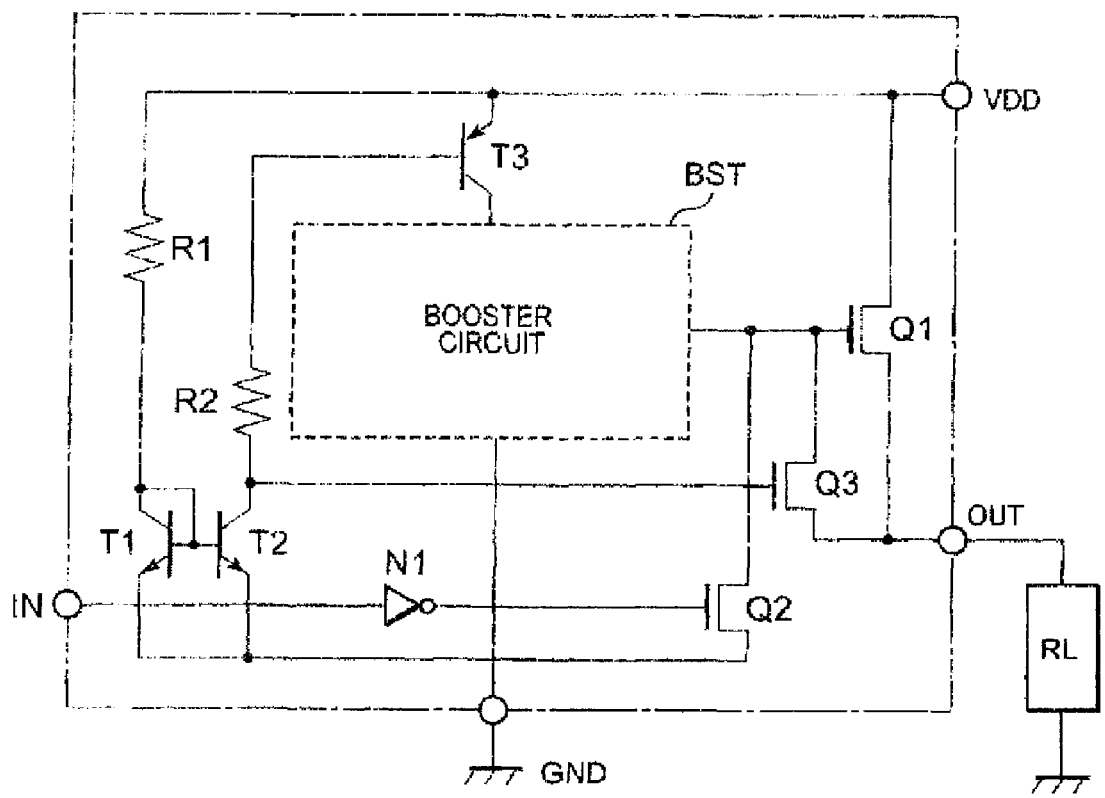
FIG. 4 is a circuit diagram of a conventional semiconductor device.
Figure 5:
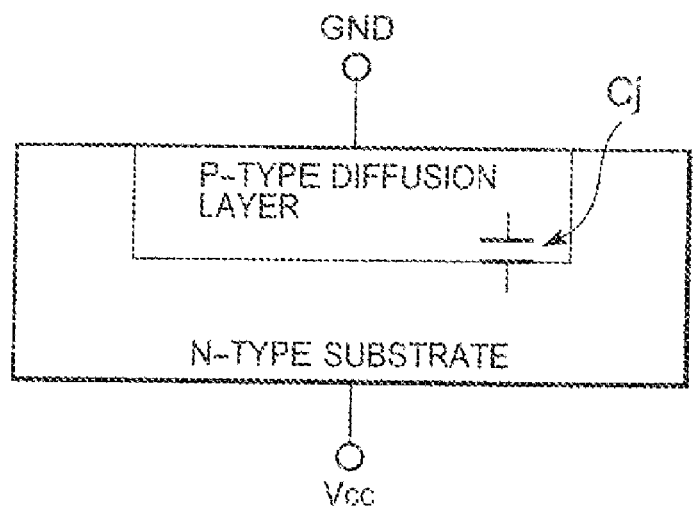
FIG. 5 schematically shows a structure of a semiconductor device.
Figure 6:
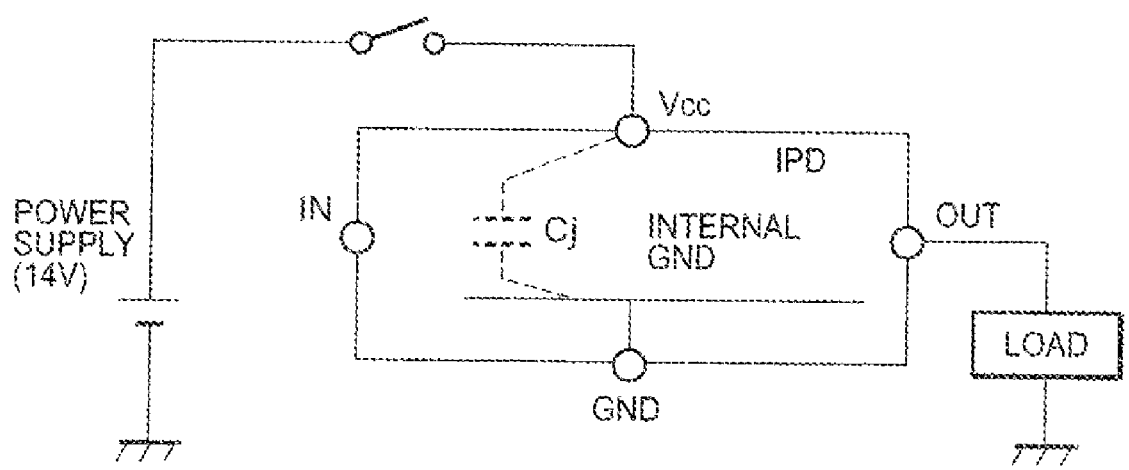
FIG. 6 schematically shows the presence of a parasitic capacitance in the semiconductor device.
Figure 7:
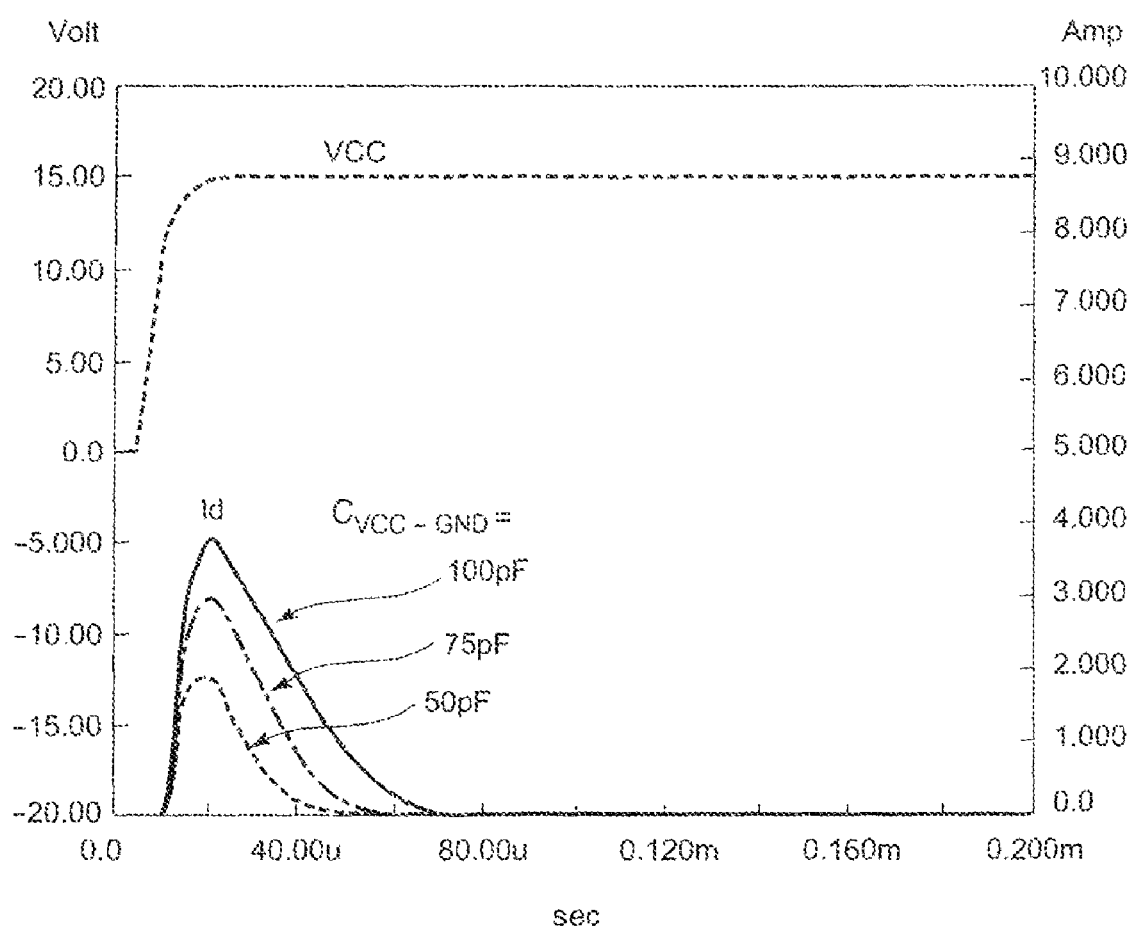
FIG. 7 shows an example of change in inrush current generated by the parasitic capacitance of the semiconductor device.

FIG. 3 is a circuit diagram of a semiconductor device according to a third embodiment of the present invention. In FIG. 3, like symbols as those in FIG. 2 indicate like components, and a description thereof will be omitted. The semiconductor device 10a in FIG. 3 shows an example of a circuit of the internal circuit 13 in FIG. 2.

In FIG. 3, the internal circuit 13 includes a booster circuit 14, an NMOS transistor NM3, PMOS transistors PM1, PM2 and PM3, constant current circuits I1 and I2, and switch circuits SW1, SW2 and SW3, and includes a function working as an abnormal off command circuit.

The booster circuit 14 has its ground side connected to the internal grounding wire GW, its power supply side connected to the power supply terminal Vcc through the PMOS transistor PM2 and the switch circuit SW2, and its output port connected to the gate of the NMOS transistor NM1 through the resistance element R3.

The NMOS transistor NM3 has its source connected to the output terminal OUT, its gate connected to the internal grounding wire GW, and its drain connected to one end of the constant current circuit It through the switch circuit SW1. The other end of the constant current circuit I1 is connected to the power supply terminal Vcc.

The PMOS transistor PM1 has its source connected to the power supply terminal Vcc, its gate connected to one end of the constant current circuit I1, and its drain connected to one end of the constant current circuit I2 the other end of which is connected to the internal grounding wire GW.

The PMOS transistor PM2 has its source connected to the power supply terminal Vcc through the switch circuit SW2, its gate connected to the drain of the PMOS transistor PM1, and its drain connected to the power supply side of the booster circuit 14.

The PMOS transistor PM3 has its source connected to the power supply terminal Vcc through the switch circuit SW3, its gate connected to the drain of the PMOS transistor PM1, and its drain connected to the output port of the booster circuit 14.

In the internal circuit 13 configured as described above, the switch circuits SW1, SW2 and SW3 are in an on state when the input terminal IN is set to be active. In these situations, an inverter composed of the constant current circuit I1 and the NMOS transistor NM3 detects a GND wire break detection signal. That is, a GND wire break is detected as follows.

When a potential difference generated by the diode D3 and the resistance element R1 becomes not smaller than a threshold value Vt of the NMOS transistor NM3, a drain potential of the NMOS transistor NM3 is lowered to the potential of the output terminal OUT (≈the potential of the GND) to turn on the PMOS transistor PM1. The PMOS transistor PM1 being on, a potential of the drains of the PMOS transistor PM1 is raised to a potential level of the power supply terminal Vcc. Accordingly, the PMOS transistors PM2 and PM3 are turned off, thereby blocking a charge injection path to the gate of the NMOS transistor NM1.

In the first and second embodiments, the NMOS transistor NM1 is turned off by connecting the gate to the source of the NMOS transistor NM1 by using the NMOS transistor NM2. In contrast, in the third embodiment, when the input terminal IN is set to be active, formed is the charge injection path from the power supply terminal Vcc to the gate of the NMOS transistor NM1. In this case, at a GND wire break, the PMOS transistors PM2 and PM3 are configured to also block the charge injection path to the gate of the NMOS transistor NM1. Such configuration can further assure the protective function.

In addition, each of the disclosures in the patent documents described above will be incorporated herein by reference. Changes and adjustments may be made to the embodiments within the range of all disclosures of the present invention (including the claims), and further based on basic technical concepts thereof. Also, various combinations or selections of a variety of elements disclosed herein may be made within the scope and spirit of the invention specified by the appended claims. That is, it should be understood that the invention includes a variety of changes and modifications which may be made by those skilled in the art according to the all disclosures including all of the claims, based on the technical concepts of the invention.

What is claimed is:

1. A semiconductor device which comprises an output MOS transistor formed in a semiconductor substrate of a first conductivity type and a diffusion region of a second conductivity type formed in the semiconductor substrate forming a pn-junction therebetween, the semiconductor substrate being connected to a power supply terminal, the diffusion region being connected to a ground terminal, comprising:
   a switching MOS transistor including a source-drain path connected between a gate and a source of the output MOS transistor, and a gate, the source of the output MOS transistor being connected to an output terminal;
   an internal ground wire connected between the gate of the switching MOS transistor and the ground terminal; and
   an electric potential difference generating circuit connected to the internal ground wire and the gate of the switching MOS transistor at a first end thereof and connected to the source of the switching MOS transistor at a second end thereof,
   wherein the switching MOS transistor is configured to be turned ON when a potential of the internal ground wire is raised due to a parasitic capacitance existing between the power supply terminal and internal ground wire caused by the pn-junction.

2. The semiconductor device according to claim 1, wherein the switching MOS transistor is turned on in response to a potential difference generated across the electric potential difference generating circuit when power is applied to the semiconductor device.

3. The semiconductor device according to claim 1, wherein the electric potential difference generating circuit generates a first potential differences between the gate and source of the switching MOS transistor when power is applied to the semiconductor device and the internal ground wire is separated from the ground terminal, and a second potential difference between the gate and source of the switching MOS transistor during normal operation,
   wherein the switching MOS transistor is turned-on in response to the first potential difference, and is turned-off in response to the second potential difference.

4. The semiconductor device according to claim 1, wherein the electric potential difference generating circuit includes a resistor having first and second ends, the first end is connected to the internal ground wire and the second end is connected to the source of the switching MOS transistor.

5. The semiconductor device according to claim 4, wherein the electric potential difference generating circuit further includes a diode inserted between the internal ground wire and the first end of the resistor.

6. The semiconductor device according to claim 1, further comprising:
   an input terminal for supplying an input signal to control the output MOS transistor; and
   a diode having an anode connected to the input terminal and a cathode connected to the internal ground wire.

7. The semiconductor device according to claim 1, further comprises a control circuit controlling the output MOS transistor, the control circuit includes a booster circuit for providing a boosted voltage for the gate of the output MOS transistor in response to a potential difference generated by the electric potential difference generating circuit.

8. A semiconductor device, comprising:
   an output MOS transistor including a source-drain path connected between a power supply terminal and an output terminal, the output MOS transistor being to provide an output current for an external load through the output terminal, the drain being formed in a semiconductor substrate of a first conductivity type;
   a switching MOS transistor including a source-drain path connected between a gate and the source of the output MOS transistor, and a gate, the source of the switching MOS transistor being coupled with the output terminal;
   an internal ground wire coupled between the gate of the switching MOS transistor and a ground terminal;
   an electric potential difference generating circuit coupled with the internal ground wire and the gate of the switching MOS transistor at a first end thereof and with the source of the switching MOS transistor at a second end thereof; and
   a diffusion region of a second conductivity type formed in the semiconductor substrate forming a pn-junction therebetween, the diffusion region being coupled with the ground terminal,
   wherein the switching MOS transistor is configured to be turned ON when a potential of the internal ground wire is raised due to a parasitic capacitance existing between the power supply terminal and internal ground wire caused by the pn-junction.

9. The semiconductor device according to claim 8, wherein the output MOS transistor and the switching MOS transistor are the same channel type.

10. The semiconductor device according to claim 8, wherein the electric potential difference generating circuit includes a resistor.

11. The semiconductor device according to claim 8, wherein the electric potential difference generating circuit includes a diode, the diode having an anode coupled to the node between the gate of the switching MOS transistor and the internal ground wire and a cathode coupled to the source of the switching MOS transistor.

12. The semiconductor device according to claim 11, wherein the electric potential difference generating circuit further includes a resistor connected in series with the diode.

13. The semiconductor device according to claim 8, further comprising:
   an input terminal for supplying an input signal to control the output MOS transistor; and
   a diode having an anode coupled to the input terminal and a cathode coupled to the internal ground wire.

14. The semiconductor device according to claim 8, further comprising:
   an input terminal for supplying an input signal to control the output MOS transistor; and
   a control circuit controlling the output MOS transistor, the control circuit includes:
      a booster circuit providing a boosted voltage to the gate of the output MOS transistor; and
      a switching circuit stopping providing the boosted voltage to the gate of the output MOS transistor in response to a predetermined potential difference generated by the electric potential difference generating circuit.

\* \* \* \* \*